(12) United States Patent
Ranta et al.

(10) Patent No.: US 7,400,495 B1
(45) Date of Patent: Jul. 15, 2008

(54) METER SOCKET ASSEMBLY EMPLOYING PHASE BALANCING BUS JUMPERS AND METER CENTER EMPLOYING THE SAME

(75) Inventors: Michael J. Ranta, Morton, IL (US); Paul D. Seff, Williamsburg, VA (US); Duvin N Tapia Silva, San José (CR); Gerardo R. Chavarria Milánes, San José (CR); Maria C. Chaves Vallejo, San José (CR); Henry Martinez Gallo, San José (CR)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/739,380

(22) Filed: Apr. 24, 2007

(51) Int. Cl.
*H02B 1/00* (2006.01)

(52) U.S. Cl. .................. 361/664; 361/660; 361/668

(58) Field of Classification Search ............ 361/624, 361/637, 660, 664, 668, 671
See application file for complete search history.

(56) References Cited

U.S. PATENT DOCUMENTS

| | | | |
|---|---|---|---|
| 4,041,358 A * | 8/1977 | Donahue et al. ............ 361/660 |
| 4,532,574 A * | 7/1985 | Reiner et al. ............... 361/660 |
| 5,936,834 A * | 8/1999 | Polston et al. ............. 361/664 |
| 5,951,324 A | 9/1999 | Campbell et al. |
| 5,980,311 A | 11/1999 | Campbell et al. |
| 5,982,611 A | 11/1999 | Campbell et al. |
| 6,012,937 A | 1/2000 | Campbell et al. |
| 6,421,229 B1 | 7/2002 | Campbell et al. |
| 6,561,844 B1 | 5/2003 | Johnson |
| 6,565,394 B2 | 5/2003 | Seff et al. |
| 6,793,542 B1 | 9/2004 | White |
| 7,018,247 B1 | 3/2006 | Ranta et al. |
| 7,147,507 B2 | 12/2006 | Johnson |
| 7,239,502 B1 * | 7/2007 | Seff et al. ................ 361/624 |
| 2002/0182930 A1 | 12/2002 | Seff et al. |
| 2006/0178044 A1 | 8/2006 | Johnson |

* cited by examiner

*Primary Examiner*—Jayprakash N Gandhi
*Assistant Examiner*—Robert J Hoffberg
(74) *Attorney, Agent, or Firm*—Martin J. Moran

(57) ABSTRACT

A meter center includes three feeder bus bars, three supply bus bars, each supply bus bar being electrically connected to a corresponding feeder bus bar, and a number of meter socket assemblies. Each meter socket assembly includes two bus jumpers, each bus jumper including a first end and a second end, the second end of a first bus jumper being selectively electrically connected to a first supply bus bar, the second end of a different second bus jumper being selectively electrically connected to a different second supply bus bar, two load bus bars, insulative support members coupled to a number of the supply bus bars, the insulative support members including a first end coupled to the bus jumpers and an opposite second end supporting the load bus bars, and a meter socket including terminals electrically connected to the first ends of the bus jumpers and to the load bus bars.

24 Claims, 6 Drawing Sheets

US 7,400,495 B1

METER SOCKET ASSEMBLY EMPLOYING PHASE BALANCING BUS JUMPERS AND METER CENTER EMPLOYING THE SAME

BACKGROUND OF THE INVENTION

1. Field of the Invention

The invention pertains generally to meter centers for electrical power distribution systems and, more particularly, to meter centers including a number of meter socket assemblies structured to provide a number of selected phase combinations among a number of meters. The invention also relates to meter socket assemblies for a meter center. The invention further relates to insulative support members for a meter socket assembly.

2. Background Information

Meter centers including a plurality of watt-hour meters are commonly used to measure electric power consumed by, for example, the various tenants of a multi-unit residential site (e.g., without limitation, an apartment building) or commercial site (e.g., without limitation, an office complex).

It is known to provide the same phase combination (e.g., phasings AB, BC or AC) for meter socket assemblies within multiple meter panel boards or load centers. This provides the same phase combination of meter sockets within meter centers having multiple meters. Each of the meter sockets plugs onto a corresponding meter socket assembly structure that accommodates two tenant buses and only two phase buses.

FIGS. 1 and 2 show a conventional meter center assembly 1, which generally consists of a cabinet 3 having an internal longitudinal wall 5 that divides the cabinet 3 into side-by-side meter and disconnect switch compartments 7,9. A plurality of plug-in, socket type watt-hour meters 11 are mounted within the meter compartment 7, one meter 11 for each tenant circuit which is to be metered. Thus, in the example of FIG. 1, the meter center 1 accommodates four tenant circuits each served by its own meter 11. Each tenant circuit is also provided with a disconnect switch 13 such as, for example, a circuit breaker, which is mounted within the disconnect switch compartment 9.

Electric power is provided to the meter center 1 by feeder buses 17 which are electrically connected to the utility lines (not shown) that supply power. Specifically, as shown in FIG. 2, three phase buses 17A,17B,17C and a neutral bus 17N extend horizontally through the cabinet 3 for electrical connection to the utility lines (not shown). A set of supply buses 27 extends vertically within the meter compartment 7 and electrically connects to the feeder buses 17. More specifically, the supply buses 27 generally comprise a pair of spaced apart bus bars 29R,29L, which are each electrically connected to one of the feeder buses 17A,17B,17C by one of the phase balancers 47A,47B. For example, the left supply bus 29L in the example of FIG. 2 is electrically connected to the phase A feeder bus 17A by phase balancer 47A, and the right supply bus 29R is electrically connected to the phase B feeder bus 17B by phase balancer 47B. Phase balancer 47A generally consists of a cylindrical sleeve 49 (shown in hidden line drawing) and bolt 51. Phase balancer 47B generally consists of a Z-shaped member 53 and bolts 55. Thus, the entire meter center 1 is configured in the same manner, in this case phase AB, although it will be appreciated that it could also be entirely phased AC (for feeder buses 17A and 17C) or BC (for feeder buses 17B and 17C).

It is also known to provide a meter center wherein different meters within the same cabinet are phased differently on two different phase combinations (e.g., on two of phase combinations AB, AC, and BC, such as AC and BC). One of the supply buses is divided in order to include a first section being in electrical communication with a first feeder bus (e.g., phase A) and a second section being in electrical communication with a second feeder bus (e.g., phase B) in order to provide a first number of the meter sockets with a first phase configuration (e.g., phasing AC) and a second number of the meter sockets with a different second phase configuration (e.g., phasing BC). A first phase connector (e.g., phase A) electrically interconnects the first section of the first supply bus with a corresponding feeder bus (e.g., phase A), a second phase connector (e.g., phase B) electrically interconnects the second section of the first supply bus with a corresponding feeder bus (e.g., phase B), and a third phase connector (e.g., phase C) electrically interconnects the second supply bus with a corresponding feeder bus (e.g., phase C).

Among other disadvantages, this makes phase balancing (i.e., distributing the electrical load) impossible among all three phase combinations in the same meter center.

There is, therefore, room for improvement in meter centers and in meter socket assemblies therefor.

SUMMARY OF THE INVENTION

These needs and others are met by embodiments of the invention, which provide a meter socket assembly, or a meter center including the same, in which the meter socket assembly includes two bus jumpers that are each selectively electrically connectable to a different supply bus bar, in order to selectively provide different phase combinations from plural supply bus bars.

In accordance with one aspect of the invention, a meter center comprises: at least three feeder bus bars; three supply bus bars, each of the supply bus bars being electrically connected to a corresponding one of the at least three feeder bus bars; and a number of meter socket assemblies, each of the number of meter socket assemblies comprising: two bus jumpers, each of the bus jumpers comprising a first end and a second end, the second end of a first one of the bus jumpers being selectively electrically connected to a first one of the supply bus bars, the second end of a different second one of the bus jumpers being selectively electrically connected to a different second one of the supply bus bars, two load bus bars, at least one insulative support member coupled to a number of the supply bus bars, the at least one insulative support member comprising a first end coupled to the bus jumpers and an opposite second end supporting the load bus bars, and a meter socket comprising a plurality of terminals electrically connected to the first ends of the bus jumpers and to the load bus bars.

The opposite second end of the at least one insulative support member may include at least a first slot structured to support a first one of the load bus bars and a second slot structured to support a different second one of the load bus bars.

The at least one insulative support member is a first insulative support member coupled to a first one of the supply bus bars and a second insulative support member coupled to a different second one of the supply bus bars; and the opposite second end of the second insulative support member may further include a third slot structured to support one of the first one and the different second one of the load bus bars.

Each of the meter socket assemblies may be structured to selectively provide one of three different phase combinations from the supply bus bars.

The at least one insulative support member may be a first insulative support member coupled to a first one of the supply bus bars and a second insulative support member coupled to a different second one of the supply bus bars.

The first insulative support member may be identical to the second insulative support member.

Each of the first and second insulative support members may include a slot supporting a corresponding one of the load bus bars.

One of the first and second insulative support members may include a first slot supporting a first one of the load bus bars and a second slot supporting a different second one of the load bus bars.

The second end of each of the bus jumpers may include an opening and a fastener electrically connected to a corresponding one of the supply bus bars; and each of the bus jumpers may comprise a bus member and a stab member including the first end of such each of the bus jumpers, the bus member having a first bend portion proximate the second end of such each of the bus jumpers and a second bend portion proximate the stab member.

The bus member may be pivotally coupled to the stab member.

As another aspect of the invention, a meter socket assembly is for a meter center comprising a plurality of feeder bus bars and a plurality of supply bus bars, each of the supply bus bars being electrically connected to a corresponding one of the feeder bus bars, the meter socket assembly comprising: two bus jumpers, each of the bus jumpers comprising a first end and a second end, the second end of a first one of the bus jumpers being structured to selectively electrically connect to a first one of the supply bus bars, the second end of a different second one of the bus jumpers being structured to selectively electrically connect to a different second one of the supply bus bars; two load bus bars; at least one insulative support member structured to be coupled to a number of the supply bus bars, the at least one insulative support member comprising a first end coupled to the bus jumpers and an opposite second end supporting the load bus bars; and a meter socket comprising a plurality of terminals electrically connected to the first ends of the bus jumpers and to the load bus bars.

As another aspect of the invention, an insulative support member is for a meter socket assembly comprising two load bus bars, and two pivotal bus jumpers, each of the pivotal bus jumpers comprising a first end and a second end, the second end of a first one of the pivotal bus jumpers being structured to selectively electrically connect to a first supply bus bar, the second end of a different second one of the pivotal bus jumpers being structured to selectively electrically connect to a different second supply bus bar, the insulative support member comprising: an insulative body comprising a number of sides, a first end and an opposite second end, wherein one of the number of sides is structured to be coupled to one of the first one and the different second one of the supply bus bars, wherein the first end of the insulative body is structured to be coupled to the pivotal bus jumpers, and wherein the opposite second end of the insulative body is structured to support the load bus bars.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
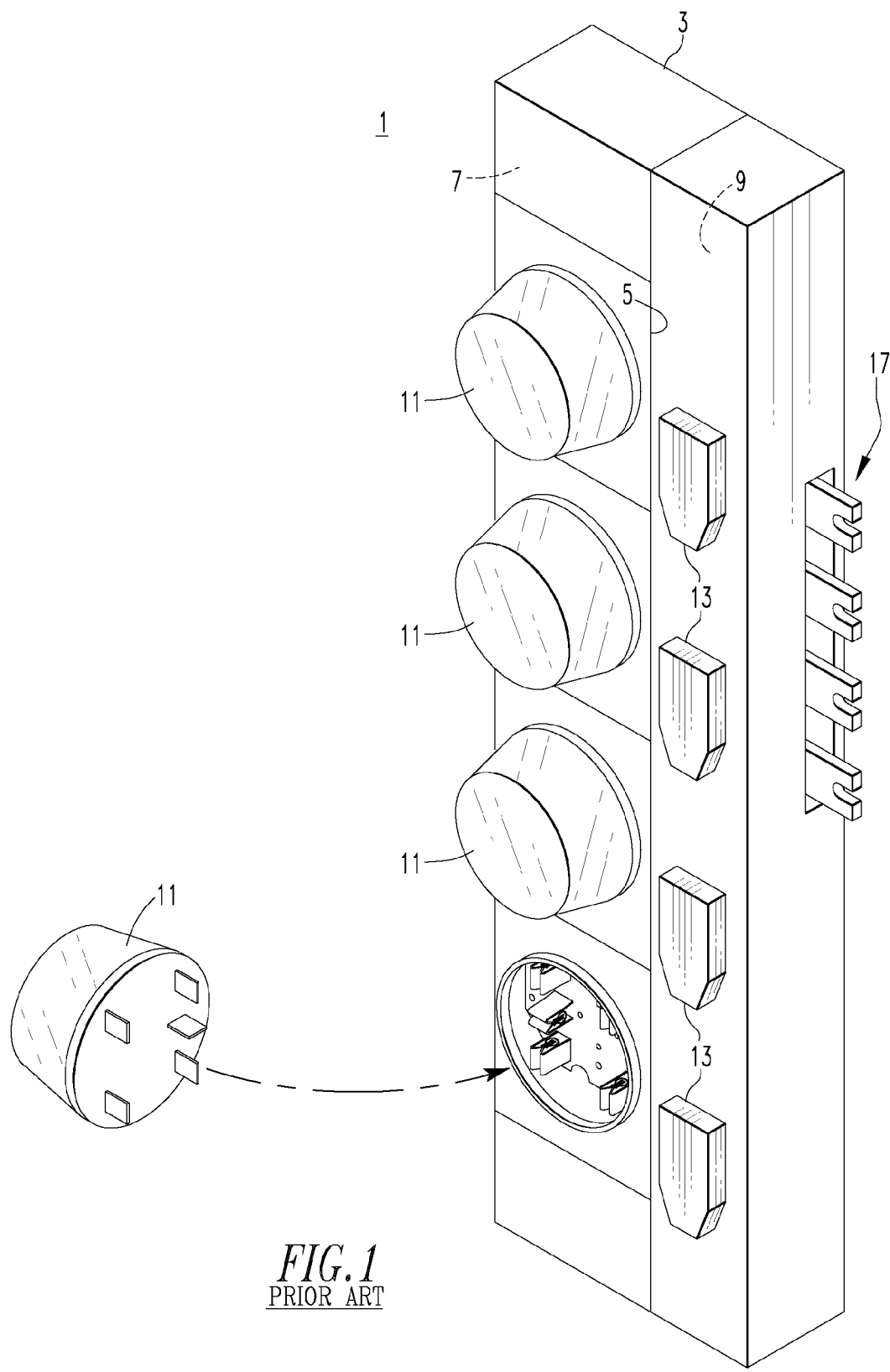
FIG. 1 is a partial exploded isometric view of a meter center including a cabinet with four meters, with one of the meters being exploded from the cabinet to show details of a meter socket assembly.
Figure 2:
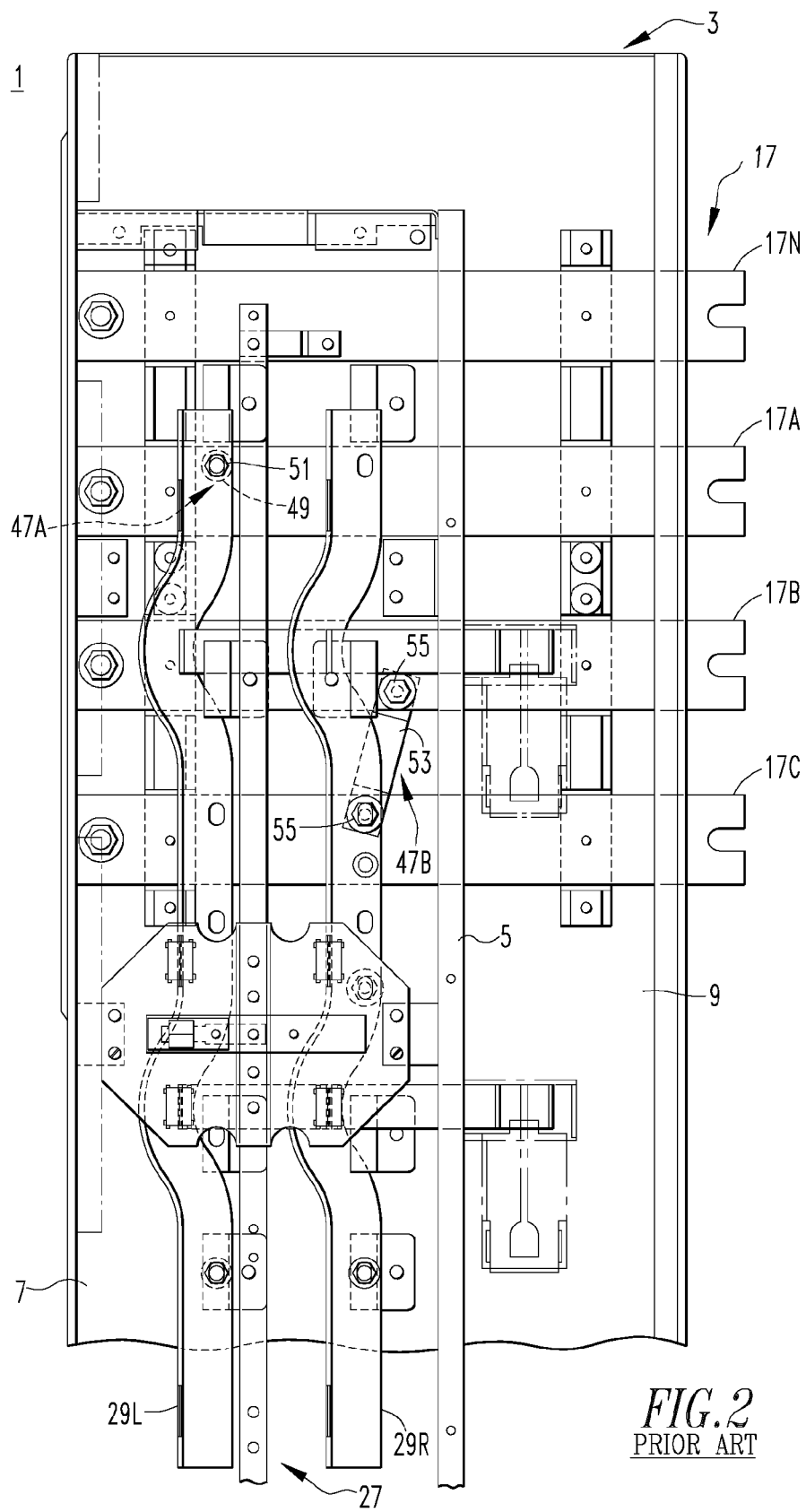
FIG. 2 is a vertical elevational view of a top portion of the meter center of FIG. 1, with the cover of the cabinet removed to show internal details.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The invention is described in association with meter socket assemblies having meter sockets with four terminals for a meter center with a feeder neutral bus bar and feeder bus bar phases A, B, C, although the invention is applicable, for example, to meter centers, which do not have a neutral bus bar and/or to meter sockets having five terminals one of which is a neutral terminal.

Figure 3:
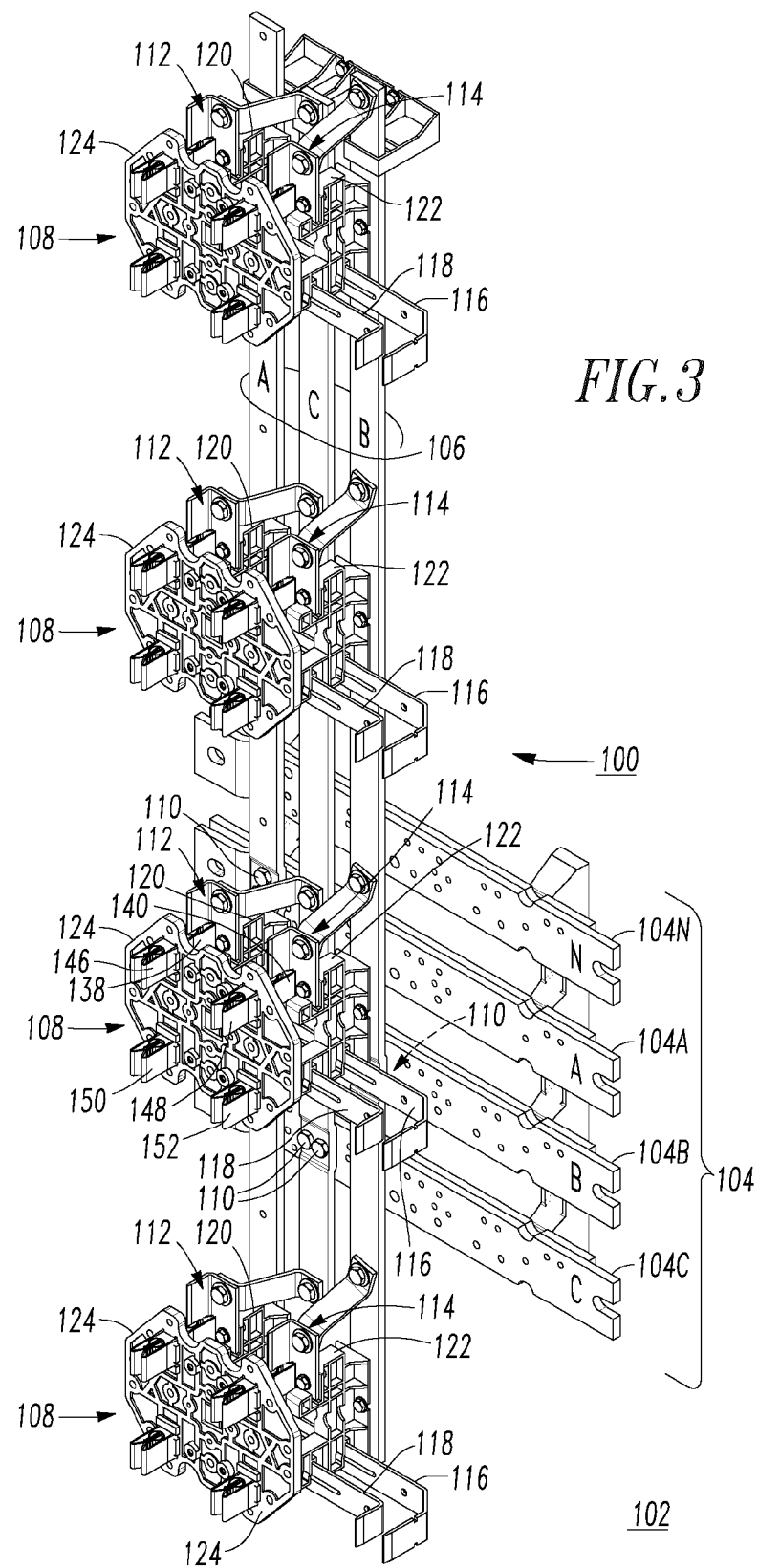
FIG. 3 is an isometric view of the bus structure of a meter center including four feeder buses, three supply buses and four meter socket assemblies in accordance with embodiments of the invention.

Referring to FIG. 3, the bus structure 100 of a meter center 102 includes four feeder buses 104, three supply buses 106 and four meter socket assemblies 108. The feeder bus bars 104 (104A,104B,104C,104N) are for phases A, B, C and neutral (N), although the invention is applicable to three bus bars for phases A, B and C. Although four meter socket assemblies 108 are shown, any suitable number (e.g., without limitation, about two to about six) of meter socket assemblies may be employed. Each of the supply bus bars 106 is electrically connected by fasteners 110 (one is shown in hidden line drawing) to a corresponding one of the three feeder bus bars 104A,104B,104C.

Figure 4:
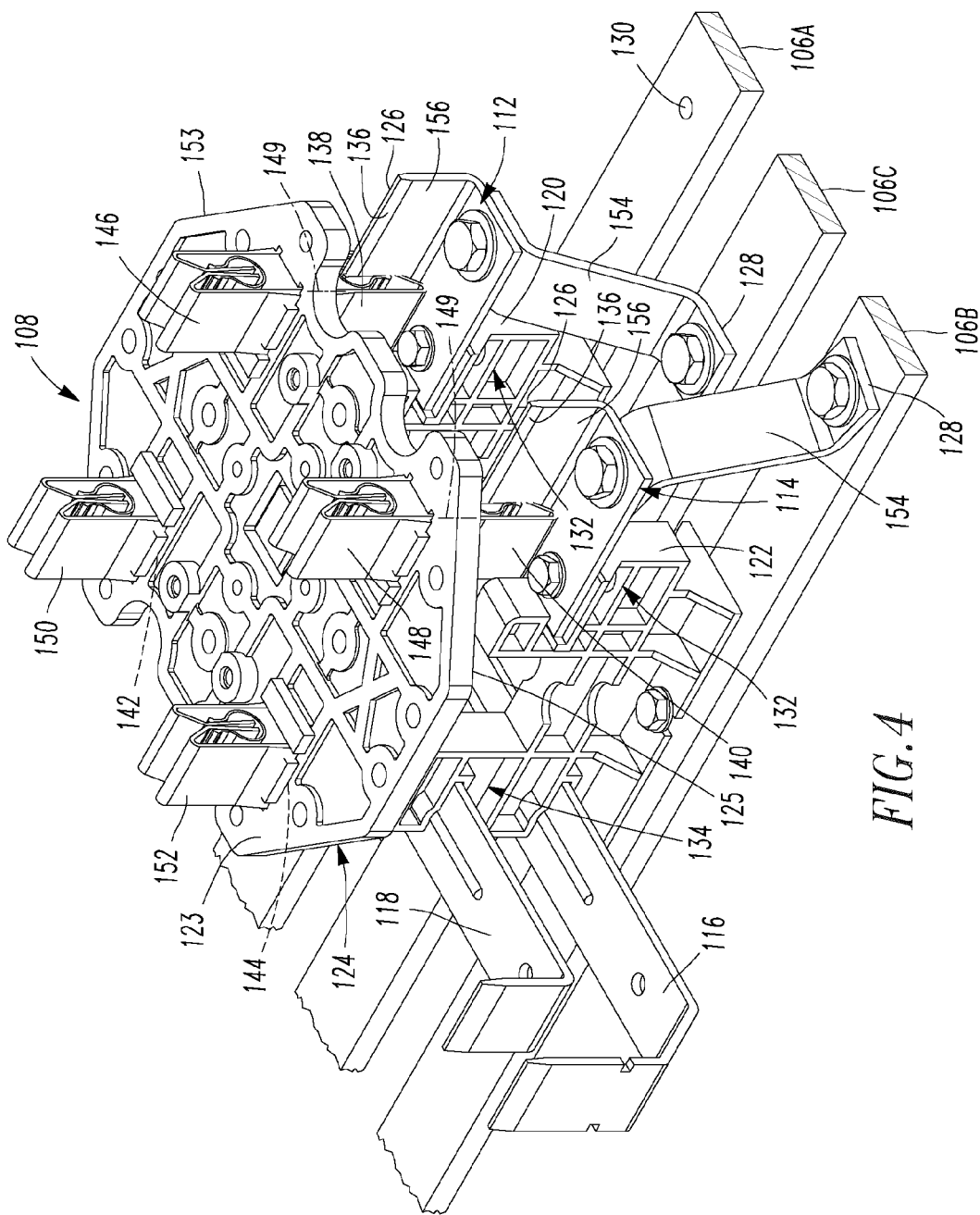
FIG. 4 is an enlarged isometric view of one of the meter socket assemblies of FIG. 3.

Each of the meter socket assemblies 108 includes two pivotal bus jumpers 112,114, two load (e.g., without limitation, tenant) bus bars 116,118, one or two insulative support members 120,122 (two insulative support members are shown in FIGS. 3-6; one insulative support member 186 is shown in phantom line drawing in FIG. 6) coupled to one or two of the supply bus bars 106 (two supply bus bars 106A and 106B are best shown in FIG. 4), and a meter socket 124.

As shown in FIG. 4, each of the pivotal bus jumpers 112, 114 includes a first end 126 and a second end 128. In this example, the second end 128 of the first pivotal bus jumper 112 is selectively electrically connected to the supply bus bar 106C, and the second end 128 of the second pivotal bus jumper 114 is selectively electrically connected to the supply bus bar 106B, thereby phasing this meter socket assembly 108 as "BC". It will be appreciated, however, that the pivotal bus jumpers 112 and 114, which have a general Z-shape, may alternatively be selectively electrically connected to the supply bus bars 106A and 106B, respectively, in order to phase this meter socket assembly 108 as phasing "AB" (in which the bus jumper 112 is selectively electrically connected to the supply bus bar 106A at opening 130) or phasing "AC" (in which the bus jumper 112 is selectively electrically connected to the supply bus bar 106A at opening 130, and the bus jumper 114 is selectively electrically connected to the supply bus bar 106C as shown in phantom line drawing in FIG. 5). In this manner, the meter socket assemblies 108 are structured to selectively provide one of three different phase combinations from the supply bus bars 106.

The insulative support members 120,122 include a first end 132 (as shown with the bus jumper 114) coupled to the bus jumpers 112,114 and an opposite second end 134 supporting one or both of the load bus bars 116,118.

Figure 5:
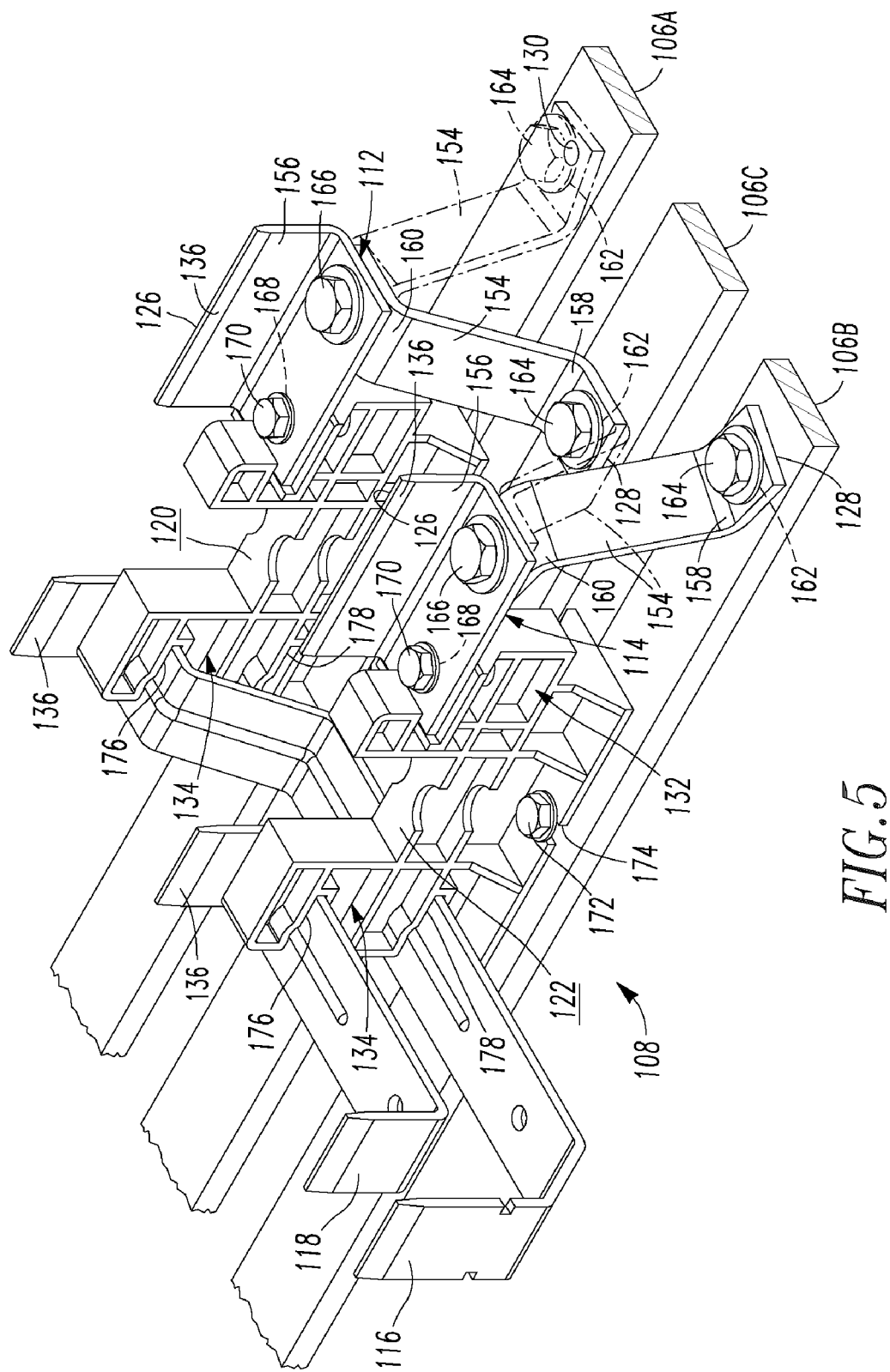
FIG. 5 is a view similar to FIG. 4 but with the meter socket removed to show additional structures of the meter socket assembly.

Referring to FIG. 5, the meter socket 124 of FIGS. 3 and 4 has been removed to show additional structures of the meter socket assembly 108. Each of the load bus bars 116,118 and the first ends 126 of the bus jumpers 112,114 includes a stab 136, which is electrically connected to a corresponding one of a first bottom terminal 138, a second bottom terminal 140, a third bottom terminal 142 (shown in hidden line drawing in FIG. 4) and a fourth bottom terminal 144 (shown in hidden line drawing in FIG. 4) of the meter socket 124 as is best shown with the terminals 138,140 in FIG. 4. Those bottom terminals 138,140,142,144 are electrically connected to top terminals 146,148,150,152, respectively, as best shown in hidden line drawing at conductor 149 in FIG. 4 and as is well known.

The terminals 138,140,142,144 are electrically connected to the stabs 136 (FIG. 5) of the bus jumpers 112,114 and the load bus bars 116,118. As best shown in FIG. 4, the meter socket 124 includes a generally planar insulative member 153 including a first upper side 123 and an opposite second lower side 125. The meter terminals 146,148,150,152 are disposed on the first side 123. Although not shown, the invention is applicable to meter sockets including a neutral terminal. Each of the first, second, third and fourth bottom terminals 138, 140,142,144 is disposed on the second side 125 and is electrically connected to a corresponding one of the terminals 146,148,150,152, respectively.

Continuing to refer to FIG. 5, each of the bus jumpers 112,114 includes a bus member 154 and a stab member 156 including the first end 126 and the stab 136 of the bus jumpers 112,114. The bus member 154 has a first bend portion 158 proximate the second end 128 of the corresponding bus jumper 112,114 and a second bend portion 160 proximate the stab member 156. The second end 128 of the bus jumpers 112,114 includes an opening 162 and a fastener 164 electrically connected to a corresponding one of the supply bus bars 106A,106B,106C (electrical connections to supply bus bars 106C and 106B are shown, with electrical connections to supply bus bars 106A and 106C being shown in phantom line drawing). The bus jumpers 112,114 are pivotally and electrically connected to the corresponding stab member 156 by a fastener 166. Each of the stab members 156 is coupled to the corresponding insulative support member 120,122 at an opening 168 by a fastener 170. Preferably, the bus jumpers 112,114 are identical and the insulative support members 120,122 are identical.

The insulative support members 120,122 are coupled to the supply bus bars 106A,106B by fasteners 172 as shown at the slot 174 of the insulative support member 122 for the supply bus bar 106B. The preferably identical insulative support member 120 is coupled to the supply bus bar 106A in a like manner as shown in FIG. 6.

Each of the first and second insulative support members 120,122 includes a slot 176 supporting a corresponding one of the load bus bars 116,118, respectively. Also, the insulative support member 122 includes a second slot 178 supporting the load bus bar 116 as it extends from the slot 176 of the insulative support member 120. In this example, since the insulative support members 120,122 are preferably identical, the insulative support member 120 includes the same slot 178, which is not used. Hence, the two insulative support members 120,122 have three slots 176,176,178 (of insulative support member 122), which support the load bus bars 116,118 as has been described.

Figure 6:
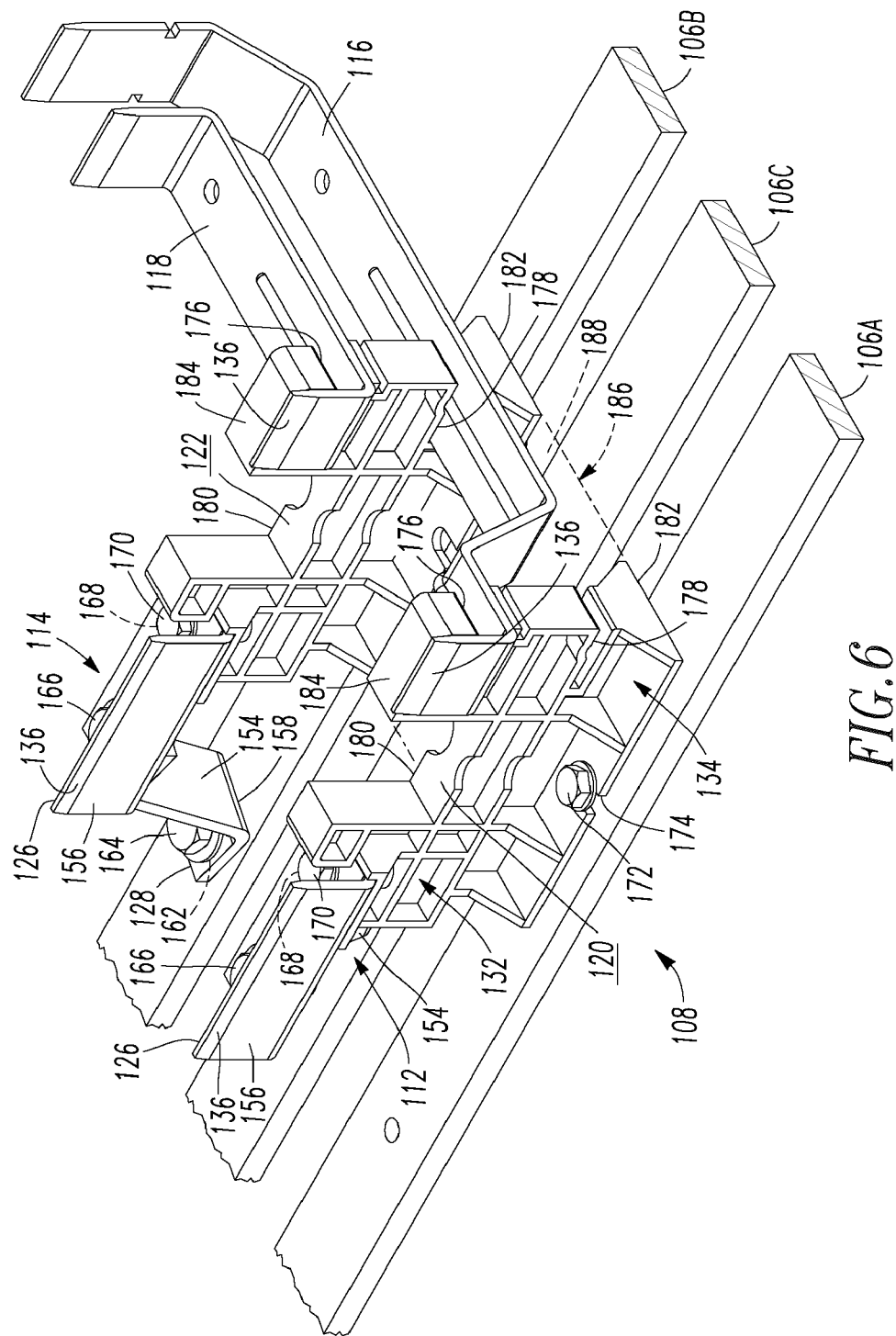
FIG. 6 is another enlarged isometric view of one of the meter socket assemblies of FIG. 3 but with the meter socket removed to show additional structures of the meter socket assembly.

As best shown in FIG. 6, the insulative support members 120,122 include an insulative body 180 having a number of sides 182,184, the first end 132 and the opposite second end 134. The bottom side 182 is coupled to the supply bus bar 106A with the fastener 172 at the slot 174, as shown. The first end 132 of the insulative body 180 is coupled to the corresponding one of the bus jumpers 112,114. The opposite second end 134 of the insulative body 180 supports one or both of the load bus bars 116,118 (one is shown with the insulative support member 120 and both are shown with the insulative support member 122). The first end 132 of the insulative body 180 supports the stab member 156 including the first end 126 of the bus jumpers 112,114 and the bus member 154.

Although two separate and independent insulative support members 120,122 are shown, it will be appreciated that a single unitary insulative support member 186 (shown in phantom line drawing) including a planar portion 188 interconnecting the insulative support members 120,122 may alternatively be employed.

The disclosed meter center 102 (e.g., multiple meter panel board or load center) includes three supply bus bars (e.g., phases A, B and C) 106 and for each of a number of the meter socket assemblies 108, two common "Z" formed bus jumpers 112,114, which can be arranged to obtain, for the corresponding meter socket assembly 108, one of three different individual phase combinations (e.g., AB, BC or AC). The meter socket assembly 108 includes two insulative support members 120,122, which are each coupled to a corresponding one of the supply bus bars 106. The meter center 102 also includes three or four feeder buses 104 (e.g., phases A, B and C, or phases A, B, C and neutral (N)). For each of the insulative support members 120,122, a first end 132 is coupled to one end 126 of one of the bus jumpers 112,114, while the other one of the bus jumpers 112,114 is selectively electrically connected to a corresponding one of the supply bus bars 106. An opposite second end 134 of the insulative support members 120,122 supports (e.g., without limitation, holds) a corresponding one of two load buses 116,118. Preferably, one of the opposite second ends 134 of the insulative support members 120,122 supports both of the load buses 116,118. Each of the load buses 116,118 and the bus jumpers 112,114 includes a stab 136, which is electrically connected to a corresponding terminal 138,140,142,144 of the meter socket 124.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A meter center comprising:
   at least three feeder bus bars;
   three supply bus bars, each of said supply bus bars being electrically connected to a corresponding one of said at least three feeder bus bars; and
   a number of meter socket assemblies, each of said number of meter socket assemblies comprising:
      two bus jumpers, each of said bus jumpers comprising a first end and a second end, the second end of a first one of said bus jumpers being selectively electrically connected to a first one of said supply bus bars, the second end of a different second one of said bus jumpers being selectively electrically connected to a different second one of said supply bus bars,
      two load bus bars,
      at least one insulative support member coupled to a number of said supply bus bars, said at least one insulative support member comprising a first end coupled to said bus jumpers and an opposite second end supporting said load bus bars, and
      a meter socket comprising a plurality of terminals electrically connected to the first ends of said bus jumpers and to said load bus bars.

2. The meter center of claim 1 wherein the terminals of said meter socket include a first terminal electrically connected to the first end of the first one of said bus jumpers, a second terminal electrically connected to the first end of the different second one of said bus jumpers, a third terminal electrically connected to a first one of said load bus bars, and a fourth terminal electrically connected to a different second one of said load bus bars.

3. The meter center of claim 2 wherein each of said load bus bars and the first ends of said bus jumpers includes a stab which is electrically connected to a corresponding one of said first, second, third and fourth terminals.

4. The meter center of claim 2 wherein said meter socket further comprises a generally planar insulative member including a first side and an opposite second side, and a plurality of meter terminals corresponding to said first, second, third and fourth terminals; wherein said meter terminals are disposed on the first side of said generally planar insulative member; and wherein each of said first, second, third and fourth terminals is disposed on the second side of said generally planar insulative member and is electrically connected to a corresponding one of said meter terminals.

5. The meter center of claim 1 wherein the opposite second end of said at least one insulative support member includes at least a first slot structured to support a first one of said load bus bars and a second slot structured to support a different second one of said load bus bars.

6. The meter center of claim 5 wherein said at least one insulative support member is a first insulative support member coupled to a first one of said supply bus bars and a second insulative support member coupled to a different second one of said supply bus bars; and wherein the opposite second end of the second insulative support member further includes a third slot structured to support one of said first one and said different second one of said load bus bars.

7. The meter center of claim 1 wherein each of said meter socket assemblies is structured to selectively provide one of three different phase combinations from said supply bus bars.

8. The meter center of claim 1 wherein said at least one insulative support member is a first insulative support member coupled to a first one of said supply bus bars and a second insulative support member coupled to a different second one of said supply bus bars.

9. The meter center of claim 8 wherein said first insulative support member is identical to said second insulative support member.

10. The meter center of claim 8 wherein each of said first and second insulative support members includes a slot supporting a corresponding one of said load bus bars.

11. The meter center of claim 8 wherein one of said first and second insulative support members includes a first slot supporting a first one of said load bus bars and a second slot supporting a different second one of said load bus bars.

12. The meter center of claim 1 wherein said bus jumpers have a general Z-shape.

13. The meter center of claim 1 wherein the second end of each of said bus jumpers includes an opening and a fastener electrically connected to a corresponding one of said supply bus bars; and wherein each of said bus jumpers comprises a bus member and a stab member including the first end of said each of said bus jumpers, said bus member having a first bend portion proximate the second end of said each of said bus jumpers and a second bend portion proximate said stab member.

14. The meter center of claim 13 wherein said bus member has a general Z-shape.

15. The meter center of claim 13 wherein said bus member is pivotally coupled to said stab member.

16. The meter center of claim 1 wherein said bus jumpers are identical.

17. The meter center of claim 1 wherein said at least three feeder bus bars comprise three feeder phase bus bars and one feeder neutral bus bar.

18. A meter socket assembly for a meter center, said meter center comprising a plurality of feeder bus bars and a plurality of supply bus bars, each of said supply bus bars being electrically connected to a corresponding one of said feeder bus bars, said meter socket assembly comprising:
   two bus jumpers, each of said bus jumpers comprising a first end and a second end, the second end of a first one of said bus jumpers being structured to selectively electrically connect to a first one of said supply bus bars, the second end of a different second one of said bus jumpers being structured to selectively electrically connect to a different second one of said supply bus bars;
   two load bus bars;
   at least one insulative support member structured to be coupled to a number of said supply bus bars, said at least one insulative support member comprising a first end coupled to said bus jumpers and an opposite second end supporting said load bus bars; and
   a meter socket comprising a plurality of terminals electrically connected to the first ends of said bus jumpers and to said load bus bars.

19. The meter socket assembly of claim 18 wherein said at least one insulative support member is a first insulative support member structured to be coupled to a first one of said supply bus bars and a second insulative support member structured to be coupled to a different second one of said supply bus bars; wherein the opposite second end of said first insulative support member includes a first slot structured to support a first one of said load bus bars; and wherein the opposite second end of said second insulative support member includes a second slot structured to support a different second one of said load bus bars and a third slot structured to support the first one of said load bus bars.

20. The meter socket assembly of claim 18 wherein said bus jumpers are identical.

21. The meter socket assembly of claim 18 wherein said bus jumpers are structured to selectively provide one of three different phase combinations from said supply bus bars.

22. An insulative support member for a meter socket assembly, said meter socket assembly comprising two load bus bars, and two pivotal bus jumpers, each of said pivotal bus jumpers comprising a first end and a second end, the second end of a first one of said pivotal bus jumpers being structured to selectively electrically connect to a first supply bus bar, the second end of a different second one of said pivotal bus jumpers being structured to selectively electrically connect to a different second supply bus bar, said insulative support member comprising:

an insulative body comprising a number of sides, a first end and an opposite second end, wherein one of said number of sides is structured to be coupled to one of the first one and the different second one of said supply bus bars, wherein the first end of said insulative body is structured to be coupled to said pivotal bus jumpers, and wherein the opposite second end of said insulative body is structured to support said load bus bars.

23. The insulative support member of claim 22 wherein the opposite second end of said insulative body includes a first slot structured to support a first one of said load bus bars and a different second slot structured to support a different second one of said load bus bars.

24. The insulative support member of claim 22 wherein the first end of said insulative body is further structured to support a stab member including the first end of said each of said pivotal bus jumpers and a pivotal bus member including a first bend portion proximate the second end of said each of said pivotal bus jumpers and a second bend portion proximate said stab member.

* * * * *